United States Patent
Watabe et al.

(10) Patent No.: US 11,742,439 B2
(45) Date of Patent: Aug. 29, 2023

(54) DRYING METHOD OF POLYIMIDE PASTE AND MANUFACTURING METHOD OF SOLAR CELL HAVING HIGH PHOTOELECTRIC CONVERSION EFFICIENCY

(71) Applicant: SHIN-ETSU CHEMICAL CO., LTD., Tokyo (JP)

(72) Inventors: Takenori Watabe, Annaka (JP); Hiroshi Hashigami, Annaka (JP); Hiroyuki Ohtsuka, Karuizawa-machi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 527 days.

(21) Appl. No.: 16/759,467

(22) PCT Filed: Aug. 24, 2018

(86) PCT No.: PCT/JP2018/031330
§ 371 (c)(1),
(2) Date: Apr. 27, 2020

(87) PCT Pub. No.: WO2019/082495
PCT Pub. Date: May 2, 2019

(65) Prior Publication Data
US 2020/0303570 A1 Sep. 24, 2020

(30) Foreign Application Priority Data
Oct. 26, 2017 (JP) .................. 2017-207107

(51) Int. Cl.
*H01L 31/0224* (2006.01)
*B05D 3/02* (2006.01)
(Continued)

(52) U.S. Cl.
CPC .... *H01L 31/022441* (2013.01); *B05D 3/0254* (2013.01); *B05D 3/105* (2013.01);
(Continued)

(58) Field of Classification Search
CPC ......... H01L 31/0216; H01L 31/022425; H01L 31/022441; H01L 31/0682; B05D 3/0254;
(Continued)

(56) References Cited

U.S. PATENT DOCUMENTS 6,099,959 A 8/2000 Konrad et al.
2008/0017243 A1 1/2008 De Ceuster et al.
(Continued)

FOREIGN PATENT DOCUMENTS

CN 104107794 A 10/2014
CN 106463549 A 2/2017
(Continued)

OTHER PUBLICATIONS

Sep. 25, 2018 Search Report issued in International Patent Application No. PCT/JP2018/031330.
(Continued)

*Primary Examiner* — Cheung Lee
(74) *Attorney, Agent, or Firm* — Oliff PLC

(57) ABSTRACT

A drying method of a polyimide paste which can maintain a printing shape while maintaining productivity includes an organic solvent and a polyimide resin dissolved in the organic solvent, and which becomes cured polyimide by being cured as a result of being dried and heated, the drying method including a step of applying the polyimide paste to a surface of a base material, a step of applying a solvent including a polar material to a surface of the base material at least at a portion where the polyimide paste is applied, and
(Continued)

a step of, after applying the solvent including the polar material, drying the polyimide paste and the solvent including the polar material.

10 Claims, 3 Drawing Sheets

(51) Int. Cl.
  *B05D 3/10* (2006.01)
  *C08G 73/10* (2006.01)
  *C08J 5/18* (2006.01)
  *H01L 31/068* (2012.01)
  *H01L 31/0216* (2014.01)
  *H01L 31/18* (2006.01)

(52) U.S. Cl.
  CPC ............ *B05D 3/107* (2013.01); *B05D 3/108* (2013.01); *C08G 73/10* (2013.01); *C08J 5/18* (2013.01); *H01L 31/0216* (2013.01); *H01L 31/0224* (2013.01); *H01L 31/0682* (2013.01); *C08J 2379/08* (2013.01); *H01L 31/18* (2013.01); *Y02E 10/544* (2013.01); *Y02E 10/546* (2013.01); *Y02E 10/547* (2013.01); *Y02E 10/549* (2013.01)

(58) Field of Classification Search
  CPC ........ B05D 3/105; B05D 3/107; B05D 3/108; C08G 73/10; C08J 5/15; C08J 2379/08
  See application file for complete search history.

(56) References Cited

U.S. PATENT DOCUMENTS

| | | |
|---|---|---|
| 2008/0299297 A1 | 12/2008 | Cousins et al. |
| 2013/0310482 A1* | 11/2013 | Win ................. H01L 31/02327 523/135 |
| 2017/0170338 A1 | 6/2017 | Matsuo et al. |
| 2017/0186894 A1 | 6/2017 | Endo et al. |

FOREIGN PATENT DOCUMENTS

| | | |
|---|---|---|
| CN | 106575679 A | 4/2017 |
| JP | S62-234575 A | 10/1987 |
| JP | H04-025583 A | 1/1992 |
| JP | H06-025614 A | 2/1994 |
| JP | H09-055567 A | 2/1997 |
| JP | 2003-285000 A | 10/2003 |
| JP | 2010-528487 A | 8/2010 |
| JP | 2011-062674 A | 3/2011 |
| JP | 2012-069592 A | 4/2012 |
| JP | 2013-153212 A | 8/2013 |
| JP | 2016-072467 A | 5/2016 |
| KR | 20170057231 A | 5/2017 |
| WO | 2015/190024 A1 | 12/2015 |

OTHER PUBLICATIONS

Jun. 8, 2022 Search Report in Chinese Patent Application No. 201880069210.2.
Jun. 11, 2021 Extended Search Report issued in European Patent Application No. 18869781.7.
Jun. 18, 2021 Office Action issued in Indian Patent Application No. 202047017592.
Apr. 28, 2020 International Preliminary Report on Patentability issued in International Patent Application No. PCT/JP2018/031330.
Nov. 24, 2021 Office Action issued in Chinese Patent Application No. 201880069210.2.
Sep. 1, 2020 Office Action issued in Japanese Patent Application No. 2017-207107.
Mar. 28, 2023 Office Action issued in Korean Patent Application No. 2020-7011694.

\* cited by examiner

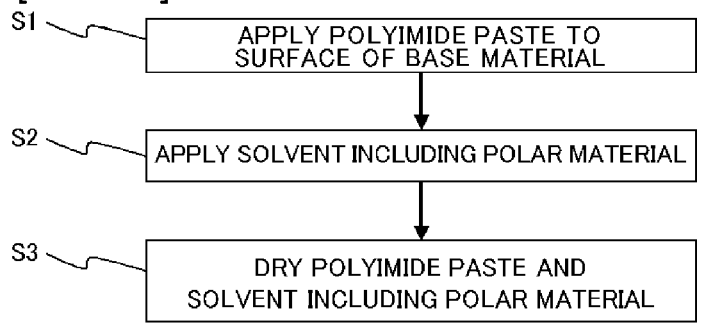
[FIG. 1]
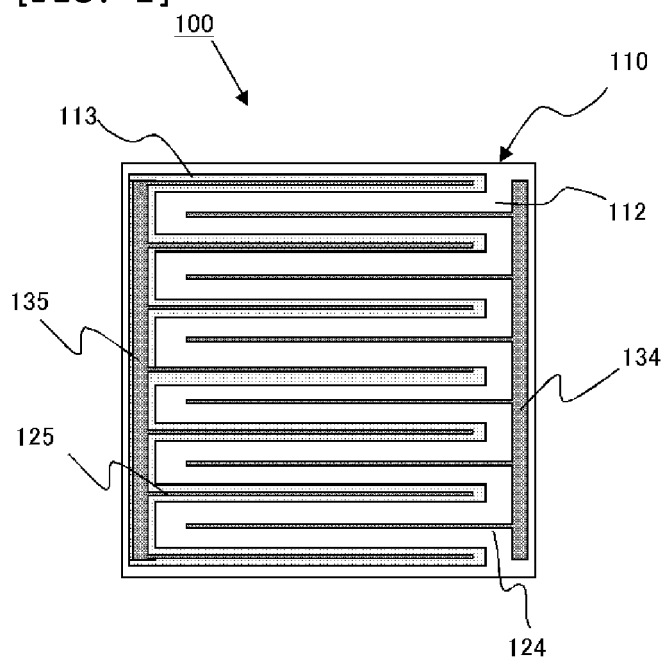
[FIG. 2]
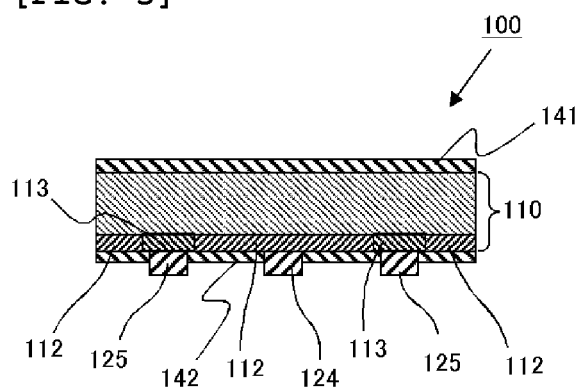
[FIG. 3]

[FIG. 4]
(a) 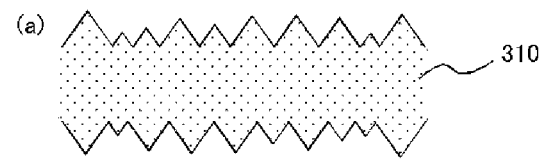
(b) 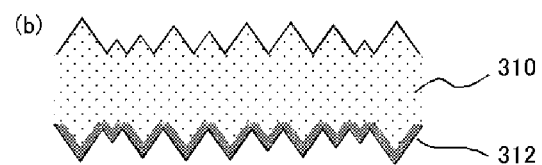
(c) 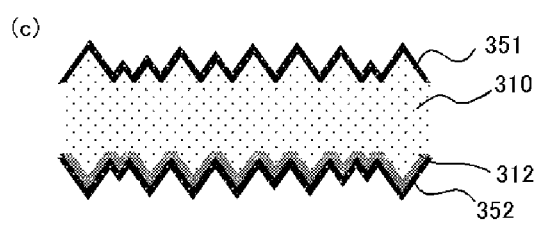
(d) 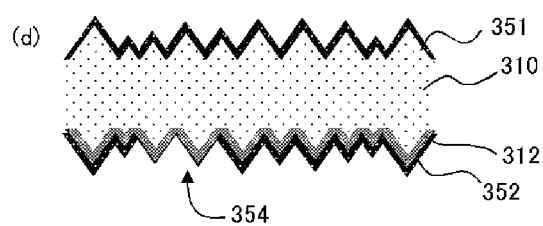
(e) 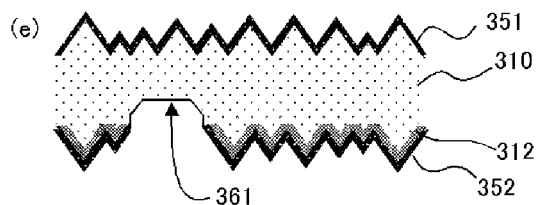
(f) 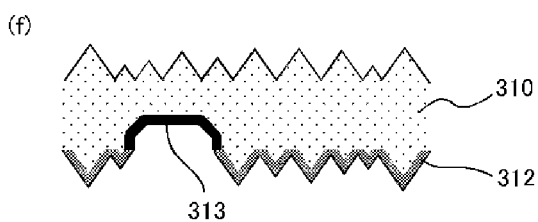
(g) 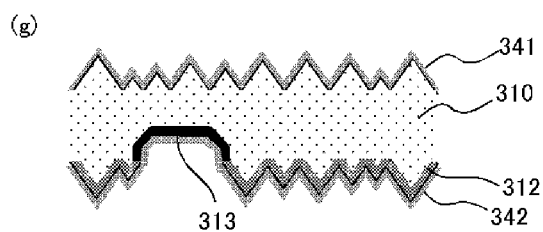
(h) 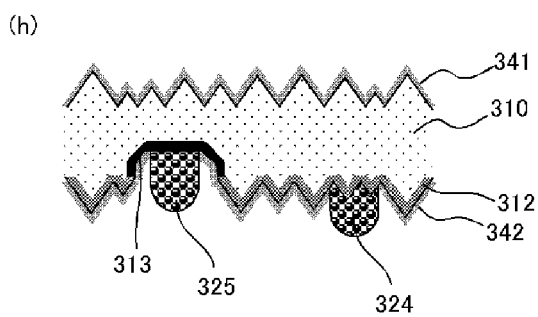

[FIG. 5]
(a)
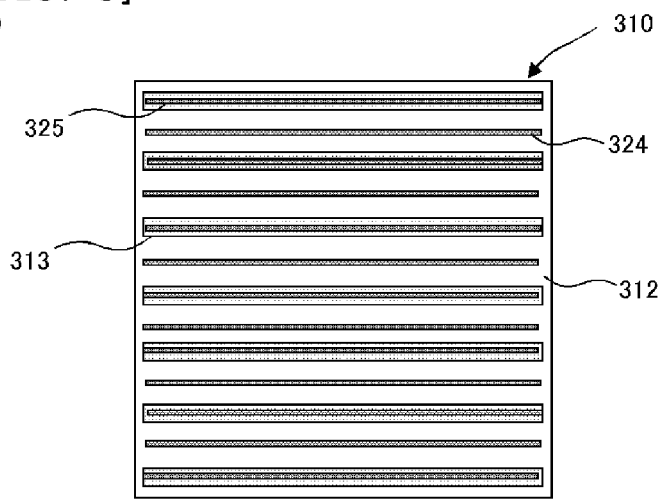
(b)
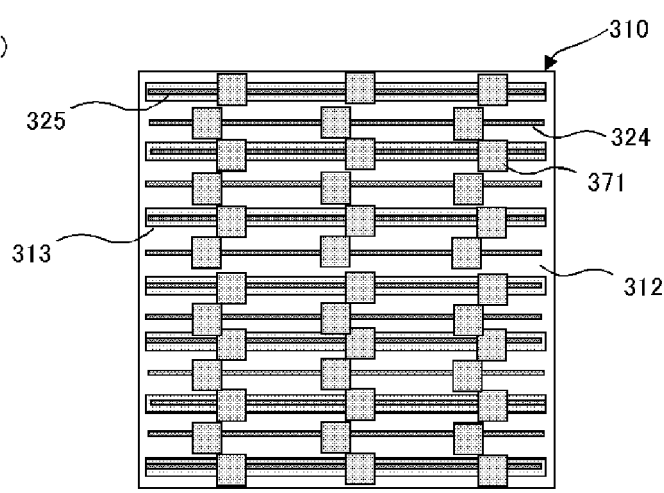
(c)
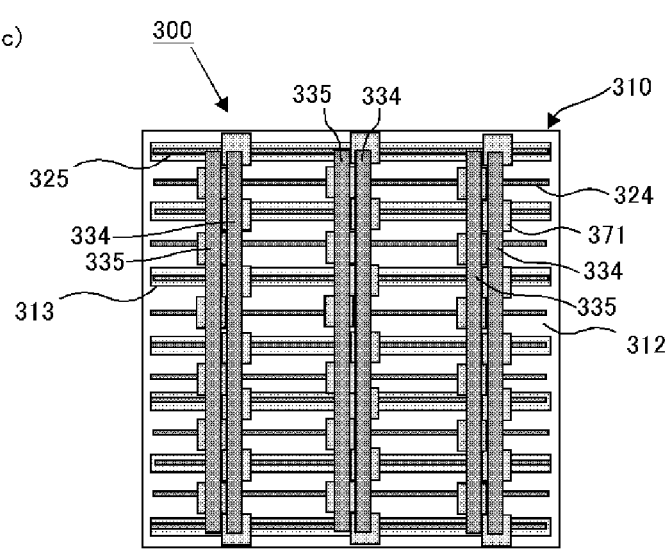

DRYING METHOD OF POLYIMIDE PASTE AND MANUFACTURING METHOD OF SOLAR CELL HAVING HIGH PHOTOELECTRIC CONVERSION EFFICIENCY

TECHNICAL FIELD

The present invention relates to a drying method of a polyimide paste and a manufacturing method of a solar cell.

BACKGROUND ART

As one of structures of a solar cell having relatively high photoelectric conversion efficiency using a single-crystal semiconductor substrate or a polycrystalline semiconductor substrate, there is a back contact type solar cell in which all positive and negative electrodes are provided on a non-light-receiving surface (back side). An overview of the back side of this back contact type solar cell is illustrated in FIG. 2. On the back side of a solar cell 100 (back side of a solar cell semiconductor substrate 110), emitter layers 112 and base layers 113 are alternately arranged, and electrodes 124 and 125 (emitter electrodes 124 and base electrodes 125) are provided along the respective layers. Further, bus bar electrodes 134 and 135 (an emitter electrode bus bar 134 and a base electrode bus bar 135) for collecting currents obtained from these electrodes are provided. Functionally, the bus bar electrodes are often orthogonal to collecting electrodes. A width of the emitter layer 112 is often from several mm to several hundred μm, and a width of the base layer 113 is often from several hundred μm to several tens μm. Further, a width of the electrode is typically approximately from several hundred to several tens μm, and the electrode is often called a finger electrode.

A schematic diagram of a cross-sectional structure of the solar cell 100 is illustrated in FIG. 3. The emitter layers 112 and the base layers 113 are formed in the vicinity of an outermost surface of the back side of the substrate 110. Each film thickness of the emitter layer 112 and the base layer 113 is typically approximately 1 μm at most. On each layer, the finger electrodes 124 and 125 (the emitter electrodes 124 and the base electrodes 125) are provided, and a surface of a non-electrode region is covered with a dielectric film (backside passivation film) 142 such as a silicon nitride film and a silicon oxide film. On a light receiving surface side, an antireflection film 141 is provided for the purpose of reducing reflectance loss.

To improve internal resistance loss by finger resistance, a structure in which a plurality of bus bars are provided is publicly known, for example, in Patent Document 1. A structure of a back side of this solar cell has a structure as schematically illustrated in FIG. 5(c) which will be described in detail later. This is a structure in which fingers and bus bars which face each other are connected via an insulating film. As a manufacturing method of this structure, there is a method in which, after fingers are formed, an insulating paste such as a polyimide paste is printed in a pattern shape, dried and cured, and bus bars are formed on this with a low-temperature curing conductive paste, which will be described in detail later.

While other examples of application of a polyimide paste to a solar cell are publicly known in Patent Documents 3 to 5, or the like, it is necessary to reproducibly form a fine pattern in either example.

CITATION LIST

Patent Literature

Patent Document 1: WO2015/190024A1
Patent Document 2: JPS62-234575A
Patent Document 3: JP2012-69592A
Patent Document 4: JP2010-528487A
Patent Document 5: JP2013-153212A

SUMMARY OF INVENTION

Technical Problem

While, after a polyimide paste is applied through printing, or the like, it is necessary to dry the polyimide paste at a temperature of approximately from 50 to 300° C., if the polyimide paste is exposed to a high temperature, fluidity is expressed, and there is a problem that a print expands (drops) from a desired shape. Because an amount of dropping is not fixed, it is impossible to solve this problem by making a pattern smaller in advance.

To suppress fluidity, a method for performing treatment at a high temperature after performing treatment at a low temperature for a fixed period to volatilize a solvent to some extent is publicly known in Patent Document 2. While a problem of dropping of a print is solved by this method, at the same time, degradation of productivity such as increase in a treatment period and increase in a size of a treatment apparatus, occurs.

The present invention has been made in view of the above-mentioned problems, and is directed to providing a drying method of a polyimide paste which can maintain a shape while maintaining productivity. Further, the present invention is directed to providing a manufacturing method of a solar cell which can dry a polyimide paste while maintaining productivity and maintaining a shape when a solar cell which includes a cured polyimide film as part of a structure of the solar cell is manufactured.

Solution to Problem

To achieve the above-described object, the present invention provides a drying method of a polyimide paste which includes an organic solvent and a polyimide resin dissolved in the organic solvent, and which becomes cured polyimide by being cured as a result of being dried and heated, the drying method including a step of applying the polyimide paste to a surface of a base material, a step of applying a solvent including a polar material to a surface of the base material at least at a portion where the polyimide paste is applied, and a step of, after applying the solvent including the polar material, drying the polyimide paste and the solvent including the polar material.

According to such a drying method of a polyimide paste, it is possible to suppress dropping of the paste upon drying. Therefore, it is possible to reproducibly obtain a pattern in a desired shape without increasing a drying period, that is, while maintaining productivity.

At this time, the polar material is preferably at least one type among water, ethylene glycol, acetic acid, methanol, ethanol, 1-propanol, 2-propanol, 1-butanol, and formic acid.

By using such a polar material, it is possible to further effectively suppress dropping of the paste upon drying.

Further, the solvent including the polar material is preferably a solvent which includes the polar material of equal to or more than one percent by mass.

By using the polar material at such a rate, it is possible to further effectively suppress dropping of the paste upon drying.

Further, the present invention provides a manufacturing method of a solar cell which includes a cured polyimide film formed with cured polyimide as part of a structure of the solar cell, the manufacturing method including a step of, when the cured polyimide film is formed, drying a polyimide paste using the drying method of the polyimide paste according to one of the above-described methods.

Further, more specifically, the present invention provides a manufacturing method of a solar cell which includes a cured polyimide film formed with cured polyimide as part of a structure of the solar cell, the manufacturing method including a step of forming a pn junction which joins a p-type layer and an n-type layer within a semiconductor substrate, a step of forming a p-type electrode which electrically contacts the p-type layer, a step of forming an n-type electrode which electrically contacts the n-type layer, and, further, when the cured polyimide film is formed, a step of applying a polyimide paste which includes an organic solvent and a polyimide resin dissolved in the organic solvent, and which becomes the cured polyimide by being cured as a result of being dried and heated, to a surface of a structure including the semiconductor substrate, a step of applying a solvent including a polar material of at least one type among water, ethylene glycol, acetic acid, methanol, ethanol, 1-propanol, 2-propanol, 1-butanol, and formic acid, to a surface of the structure including the semiconductor substrate at least at a portion where the polyimide paste is applied, a step of, after applying the solvent including the polar material, drying the polyimide paste and the solvent including the polar material, and a step of heating and curing the dried polyimide paste to form the cured polyimide film.

Further, at this time, the solvent including the polar material is preferably a solvent which includes the polar material of equal to or more than one percent by mass.

According to these manufacturing methods of the solar cell, it is possible to reproducibly obtain a pattern of a cured polyimide film in a desired shape without increasing a drying period of the polyimide paste, therefore, while maintaining productivity.

Advantageous Effects of Invention

According to the drying method of the polyimide paste of the present invention, it is possible to reproducibly obtain a pattern in a desired shape without increasing a drying period, therefore, while maintaining productivity. While, conventionally, a drying method in which a temperature is risen in two stages is required to perform drying so as not to cause dropping of a polyimide paste, by using the present invention, it becomes possible to perform dry at a high temperature from the beginning, so that it becomes possible to improve productivity as a result of reducing a size of a drying apparatus and shortening a drying period.

The drying method of a polyimide paste of the present invention can be applied to manufacturing of a solar cell, so that it becomes possible to improve productivity of manufacturing of a solar cell.

BRIEF DESCRIPTION OF DRAWINGS

FIG. 1 is a flowchart illustrating steps of a drying method of a polyimide paste of the present invention.

FIG. 2 is an overview of a typical back contact type solar cell to which the present invention can be applied.

FIG. 3 is a schematic diagram of a cross-section of a typical back contact type solar cell to which the present invention can be applied.

FIG. 4 is a schematic diagram of a cross-section illustrating an example of a manufacturing method of a back contact type solar cell to which the present invention can be applied.

FIG. 5 is a schematic diagram illustrating an example of the manufacturing method of the back contact type solar cell to which the present invention can be applied.

DESCRIPTION OF EMBODIMENTS

While an embodiment of the present invention will be described below, the present invention is not limited to this.

In the following detailed description, a number of specific details will be described to develop understanding of the whole of the present invention and to describe how the present invention is implemented with specific examples. However, it is to be understood that the present invention can be implemented without these specific details. In the following description, publicly known methods, procedure and techniques are not described in detail so as not to make the present invention unclear. While the present invention will be described with reference to specific drawings for specific examples, the present invention is not limited to these. The drawings included and described here are schematic drawings and do not limit the scope of the present invention. Further, in the drawings, sizes of some elements are exaggerated for the purpose of illustration, and, thus, are not illustrated to scale.

A polyimide paste which can be applied in a drying method of a polyimide paste of the present invention is a polyimide paste which includes an organic solvent and a polyimide resin dissolved in the organic solvent, and which becomes cured polyimide by being cured as a result of being dried and heated. That is, this polyimide paste is formed with at least polyimide molecules and a solvent, and other components such as a thixotropic agent may be mixed as necessary. Further, the polyimide paste becomes a paste form by making viscosity from 30 to 150 Pa·s, and if an arbitrary shape is drawn, its shape can be maintained. Therefore, by using a printing method, or the like, it is possible to form polyimide in a desired pattern shape on a substrate. Desired characteristics of the polyimide paste are normally obtained by a solvent being volatilized at 50 to 300° C. and cured by being heated at 250 to 400° C. However, if the polyimide paste is exposed to an atmosphere of equal to or higher than 140° C. at the beginning, a desired pattern cannot be obtained by viscosity decreasing and fluidity being expressed. To address this problem, in the present invention, after a solvent including a polar material is applied on an application surface of the substrate immediately after the polyimide paste is applied, the polyimide paste and the solvent are dried. It is preferable to perform drying at equal to or higher than 140° C.

More specifically, in the present invention, through steps illustrated in FIG. 1, the polyimide paste is dried. That is, first, the polyimide paste is applied to a surface of a base material (step S1). Here, the base material can be made a target on which the cured polyimide is to be formed.

Then, a solvent including a polar material is applied to a surface of the base material at least at a portion where the polyimide paste is applied (step S2). This solvent preferably includes one of water, ethylene glycol, acetic acid, methanol, ethanol, 1-propanol (n-propanol), 2-propanol, 1-butanol, and formic acid as the polar material. Vapor pressures of these solvents are relatively low, and increase in a drying period as a result of application of these is minor. Further, the concentration is preferably equal to or higher than one percent by mass, and may be 100 percent.

Then, after the solvent including the above-described polar material is applied, the polyimide paste and the solvent including the polar material are dried (step S3).

If the polar material as described above (the above-described polar material is also itself a solvent having polarity) is attached to the paste, polyimide molecules are precipitated from the solvent in the paste and solidified. Because fluidity as the paste is lost, if they are subjected to treatment at a high temperature, the shape does not expand. As a method for applying the solvent including the polar material, while it is also possible to use a method in which the base material is immersed into the solvent, a printing method or a spin coat method, a sufficient effect can be obtained even through spraying of a small amount of the solvent. In this manner, "application" of the solvent in the present invention includes a method for putting the surface into a state where the solvent is brought into contact with the surface at least at a portion where the polyimide paste is applied to cover the surface at the portion. Further, after the polyimide is applied, and before the solvent is applied, leaving for leveling, vacuum defoaming, or the like, may be performed as appropriate.

The above-described method can be applied to manufacturing of a solar cell. That is, in the manufacturing method of a solar cell which includes a cured polyimide film formed with cured polyimide as part of a structure of the solar cell, when the cured polyimide film is formed, it is possible to apply the drying method of a polyimide paste of the present invention.

Specifically, the drying method of a polyimide paste of the present invention can be applied to a manufacturing method of a solar cell which includes a cured polyimide film formed with cured polyimide as part of a structure of the solar cell, the manufacturing method including a step of forming a pn junction for joining a p-type layer and an n-type layer within a semiconductor substrate, a step of forming a p-type electrode which electrically contacts the p-type layer, and a step of forming an n-type electrode which electrically contacts the n-type layer. That is, the manufacturing method of the solar cell includes a step of, when a cured polyimide film is formed, applying a polyimide paste which includes an organic solvent and a polyimide resin dissolved in the organic solvent and which becomes cured polyimide by being cured as a result of being dried and heated, to a surface of a structure including a semiconductor substrate, a step of applying a solvent including a polar material to a surface of the structure including the semiconductor substrate at least at a portion where the polyimide paste is applied, a step of, after applying the solvent including the polar material, drying the polyimide paste and the solvent including the polar material, and a step of heating and curing the dried polyimide paste to form a cured polyimide film.

A further specific manufacturing method of the solar cell of the present invention will be described below using an example in a case where the manufacturing method is applied to a solar cell in Patent Document 1 using FIG. 4.

For example, as a substrate 310 for being caused to function as a photoelectric converting part of the solar cell, group V elements such as phosphorus, arsenic and antimony are doped to high-purity silicon to prepare an as-cut single-crystal {100} N-type silicon substrate 310 whose specific resistance is made 0.1 to 5 Ω·cm. The single-crystal substrate may be manufactured using either a CZ method or an FZ method. The substrate 310 does not necessarily have to be a single-crystal silicon, and may be polycrystalline silicon.

Then, minute unevenness called texture are formed on both main surfaces of the substrate 310 (FIG. 4(a)). The texture has a structure of a minute pyramid shape and is formed by utilizing characteristics that etching speed differs depending on a plane direction of a crystal. The texture is manufactured by the substrate being immersed into a heated alkaline solution (having concentration of 1 to 10% and at a temperature from 60 to 100° C.) of sodium hydroxide, potassium hydroxide, potassium carbonate, sodium carbonate, sodium hydrogen carbonate, or the like, for approximately 10 to 30 minutes. It is also possible to promote reaction by dissolving 2-propanol of a predetermined amount in the above-described solution.

After the texture is formed, the substrate is cleaned in an acid aqueous solution of hydrochloric acid, sulfuric acid, nitric acid, hydrofluoric acid, or a mixed liquid thereof. It is also possible to improve a cleaning level by mixing hydrogen peroxide.

The emitter layer 312 is formed on a first main surface of this substrate 310 (a main surface which becomes a non-light-receiving surface (back side) when this is made a solar cell) (FIG. 4(b)). The emitter layer 312 has a conductivity type (in this case, a p-type) inverse to that of the substrate 310, and has a thickness of approximately 0.05 to 2 μm. The emitter layer 312 can be formed through vapor-phase diffusion using $BBr_3$, or the like. A pair of two substrates 310 are superimposed and placed in a heat treat furnace, and is subjected to heat treatment at 950 to 1050° C. by introducing a mixed gas of $BBr_3$ and oxygen. As a carrier gas, nitrogen and argon are suitable. Further, it is also possible to form the emitter layer 312 using a method in which a coating agent including a boron source is applied to the first main surface, and heat treatment is performed at 950 to 1050° C. As the coating agent, for example, an aqueous solution including boric acid of 1 to 4% as a boron source, and polyvinyl alcohol of 0.1 to 4% as a thickener can be used. If the emitter layer 312 is formed using one of the above-described methods, a glass layer including boron is also formed at the same time on the surface of the emitter layer 312.

After the emitter layer 312 is formed, masks (diffusion masks, barrier films) 351 and 352 for forming the base layer which is the next step are formed on the both main surfaces (FIG. 4(c)). As the masks 351 and 352, a silicon oxide film, a silicon nitride film, or the like, can be used. If a CVD method is used, by selecting a type of a gas to be introduced as appropriate, it is possible to form any film. In a case of a silicon oxide film, it is possible to form the masks by thermally oxidizing the substrate 310. By the substrate 310 being subjected to heat treatment at 950 to 1100° C. in an oxygen atmosphere for 30 minutes to 4 hours, a silicon oxide film of approximately 100 to 250 nm is formed. This heat treatment may be performed within the same batch subsequent to the heat treatment for emitter formation described above. Further, while glass is formed on the surface of the substrate 310 as described above after the emitter layer 312 is formed, this glass is preferably not removed before the masks are formed particularly in a case where the emitter layer 312 is a p-type. By not removing the glass layer, it is possible to suppress increase in the number of processes and to prevent decrease in minority carrier lifetime of the substrate 310. It is considered the glass layer provides a gettering effect.

Further, in a case where boron is used as a dopant for the emitter layer 312, if the masks are formed through thermal oxidation, surface concentration of boron preferably decreases and a recombination rate on the surface decreases by a difference in a diffusion coefficient and a segregation coefficient between in Si and in $SiO_2$.

Then, as illustrated in FIG. 4(d), the mask 352 is open at a portion which becomes a base region (mask opening portion 354). Specifically, the mask 352 is opened to have an opening width of 50 to 200 μm in a shape of parallel lines at intervals of approximately 0.6 to 2.0 mm. Either a chemical method like a photolithography method or etching paste, or a physical method like laser or dicer may be used.

After the mask 352 is open, then, as illustrated in FIG. 4(e), the substrate 310 may be immersed into an alkali aqueous solution which is an aqueous solution of KOH, NaOH, or the like, which is heated at 50 to 90° C. and whose concentration is high (10 to 30%), for 1 to 30 minutes, to remove (etch) the emitter layer 312 which is unnecessary at the opening portion (recess 361 at the mask opening portion). The above-described masks 351 and 352 also function as masks for alkali etching in the present step. If this etching is performed, as illustrated in FIG. 4(e), a recess is formed on the surface of the substrate 310. A depth of the recess is determined by a depth of the emitter layer 312, and is, normally, approximately 0.5 to 10 μm. By a P-type dopant at the opening portion being removed, it becomes possible to easily control dopant concentration of the base layer. Further, because the mask is also formed on the light receiving surface side, texture on the light receiving surface is not etched.

Then, as illustrated in FIG. 4(f), the base layer 313 is formed. A vapor-phase diffusion method using phosphoryl chloride can be used to form the base layer 313. By the substrate 310 being subjected to heat treatment under an atmosphere of phosphoryl chloride and a mixture gas of nitrogen and oxygen at 830 to 950° C., a phosphorus diffusion layer ($N^+$ layer) which becomes the base layer 313 is formed. Other than the vapor-phase diffusion method, it is also possible to form the base layer using a method in which a material including phosphorus is spin coated, or heat treatment is performed after printing. Because the mask 351 is formed on the light receiving surface side upon formation of the base layer 313 (see FIG. 4(e)), phosphorus is not auto-doped on the light receiving surface side upon heat treatment. Further, because the masks 351 and 352 are unnecessary in the subsequent steps, it is not necessary to oxide the substrate 310 more than necessary or form an extra film. That is, at a time point at which heat treatment for forming the base layer is finished, a thickness of the silicon oxide film on the base layer may be equal to or less than 95 nm. Note that, in a case where the above-described etching step is performed, as illustrated in FIG. 4(f), the base layer is formed on an inner surface of the recess 361.

After the diffusion layer is formed, the masks and glass formed on the surfaces are removed with hydrofluoric acid, or the like. By this means, as illustrated in FIG. 4(f), the masks 351 and 352 are removed.

Then, an antireflection film 341 is formed on a second main surface (a main surface opposite to the above-described first main surface) (FIG. 4(g)). As the antireflection film 341, a silicon nitride film, a silicon oxide film, or the like, can be utilized. In a case of a silicon nitride film, a film of approximately 100 nm is formed using a plasma CVD apparatus. As a reaction gas, while a mixture of silane ($SiH_4$) and ammonia ($NH_3$) is often used, nitrogen can be also used in place of $NH_3$. In order to adjust a process pressure, in order to dilute the reaction gas, and, further in order to promote a bulk passivation effect of the substrate 310 in a case that a polycrystalline silicon is used for the substrate 310, there is a case where hydrogen is mixed in the reaction gas. In a case of a silicon oxide film, while the film can be also formed using a CVD method, higher characteristics can be obtained if the film is formed using a thermal oxidation method. To improve a passivation effect of the surface, it is also possible to form a silicon nitride film, a silicon oxide film, or the like, after forming an aluminum oxide film on the surface of the substrate 310 in advance.

A silicon nitride film and a silicon oxide film (backside passivation film 342) can be used also for the first main surface as a film which passivates the surface of the substrate (backside passivation film) (FIG. 4(g)). A film thickness of the backside passivation film 342 is preferably 50 to 250 nm. The backside passivation film 342 can be formed using a CVD method in a case of a silicon nitride film and can be formed using a thermal oxidation method or a CVD method in a case of a silicon oxide film in a similar manner to the antireflection film 341 on the second main surface (light receiving surface) side. Further, in a case where the substrate is an N-type as in this example, it is also possible to form a silicon nitride film, a silicon oxide film, or the like, after forming an aluminum oxide film which is effective as passivation of a P-type layer on the surface of the substrate 310 in advance. While an aluminum oxide film is formed also on the base (N-type) layer, because most part of the surface (first main surface) is the emitter (P-type) layer 312, there is minor degradation in characteristics due to this.

Then, as will be described below, the base electrodes 325 and the emitter electrodes 324 are formed (FIG. 4(h)). The base electrodes 325 are formed using, for example, a screen printing method. For example, a plate having a pattern of parallel lines at intervals of 0.6 to 2.0 mm, whose opening width is 30 to 100 μm, is prepared, and an Ag paste in which Ag powder and glass frit are mixed with an organic binder is printed along the base layer. In a similar manner, an Ag paste is printed as the emitter electrodes 324. The Ag paste for the base electrodes may be the same as or may be different from the Ag paste for the emitter electrodes. After the electrodes are printed as described above, the Ag powder is made to penetrate through (fire-through) the silicon nitride film through heat treatment, so that the electrodes are in conduction with the silicon. Burning is normally performed through treatment at a temperature from 700 to 850° C. for 1 to 5 minutes. Conventionally, it has been necessary to remove a passivation film (backside passivation film 342) on the first main surface to reduce contact resistance. However, if the emitter layer 312 is formed at a portion where texture is formed, it is possible to realize low contact resistance without removing the passivation film (backside passivation film 342). Note that it is also possible to perform burning separate for the base layer electrodes 325 and the emitter layer electrodes 324.

A bus bar forming step will be described using FIG. 5. FIG. 5(a) is a top view of the substrate 310 after the above-described step in FIG. 4(h). The emitter electrodes 324 and the base electrodes 325 are respectively formed on the emitter region (emitter layer) 312 and the base region (base layer) 313. First, a polyimide paste is applied to this substrate 310 in a pattern shape. The polyimide paste is only required to be applied in a pattern at a position of the insulating film 371 illustrated in, for example, FIG. 5(b) so that an N bus bar (in this case, a bus bar connected to the base electrodes) is not in conduction with the emitter electrodes 324, and, further, a P bus bar (in this case, a bus bar connected to the emitter electrodes) is not conduction with the base electrodes 325. A screen printing method, an ink jet method, or the like, can be used for application. After the polyimide paste is applied using, for example, a screen printing method, or the like, a solvent including a polar material is applied. Thereafter, as a drying step, drying is performed at, for example, equal to or higher than 140° C. The solvent preferably includes one of water, ethylene glycol, acetic acid, methanol, ethanol, 1-propanol (n-propanol), 2-propanol, 1-butanol, and formic acid, and concentration is preferably equal to or higher than one percent by mass. By this means, fluidity of polyimide is lost, and the shape does not expand even if treatment is performed at a high temperature. As an application method of the solvent, while a method in which the substrate is immersed into the solvent, a printing method, or a spin coat method can be used, a sufficient effect can be obtained even through spraying of a small amount of the solvent.

At last, bus bars are formed. As illustrated in FIG. 5(c), N bus bars (base electrode bus bars 335) are connected to the base electrodes 325, P bus bars (emitter electrode bus bars 334) are connected to the emitter electrodes 324, the N bus bars (base electrode bus bars 335) are connected to the emitter electrodes 324 via the insulating layers 371, and the P bus bars (emitter electrode bus bars 334) are connected to the base electrodes 325 via the insulating layers 371. As a material for the bus bars, a low-temperature curing conductive paste can be used. Specifically, a material including a conductive material of one or more types selected from Ag, Cu, Au, Al, Zn, In, Sn, Bi and Pb, and, further, a resin of one or more types selected from an epoxy resin, an acryl resin, a polyester resin, a phenol resin, and a silicone resin can be used. After the material as described above is applied in a pattern shape using, for example, a screen printing method, a dispenser, or the like, the material is cured at 100 to 400° C. for 1 to 60 minutes. Because a distance between adjacent bus bars can be shortened by increasing bus bars, it is possible to make the finger electrodes thinner, so that it is possible to reduce cost of materials of the finger electrodes. While the number of bus bars can be determined as appropriate by trade-off between increase in cost of materials as a result of the number of bus bars being increased and reduction in cost of materials by the finger electrodes being made thinner, the number of bus bars is preferably between 4 and 20. In this manner, the solar cell 300 illustrated in FIG. 5(c) is manufactured.

While an example in a case where the substrate is an N-type substrate has been described above, the present invention can be also applied in a case where the substrate is a P-type substrate. That is, it is only necessary to provide an N-type layer as the emitter layer 312 and provide a P-type layer as the base layer 313.

The present invention can be also applied to a manufacturing method of a double side electrode type solar cell in Patent Document 3. After a film of Al is formed on a back side of a substrate, and the substrate is subjected to heat treatment to form a BSF layer, the Al is removed. A polyimide paste with an opening portion is printed here. While a size of the opening is preferably from 40 to 300 μm, if the substrate is dried immediately after printing, there is a case where the pattern may drop, and the opening may become smaller. In the present invention, after printing, the paste is solidified by a solvent being sprayed, or the like, on the printing surface. By this means, dropping is suppressed, so that it is possible to realize stable manufacturing.

After a cured polyimide film is formed, Al is evaporated to make a backside electrode.

The present invention can be also applied to a manufacturing method of a back contact type solar cell in Patent Document 4. After the emitter layer and the base layer are formed on a back side of the substrate, a silicon oxide film is formed on these. A polyimide paste is screen-printed on this silicon oxide film. An opening of a plate is approximately 200 μm. Also in this case, if the substrate is dried immediately after printing, there is a case where the pattern may drop and become larger. In the present invention, after printing, the paste is solidified by a solvent being sprayed, or the like, on the printing surface. By this means, dropping is suppressed, so that it is possible to realize stable manufacturing.

After a cured polyimide film is formed, a silicon oxide film is partially open to form electrodes.

The present invention can be also applied to a manufacturing method of a back contact type solar cell in Patent Document 5. An emitter layer, a base layer and a silicon oxide film are formed on a back side of a substrate. A polyimide paste is printed in a pattern such that the polyimide paste is open only to the base layer, through screen printing or ink jet printing. While the opening is preferably approximately 30 to 300 μm, also in this case, if the substrate is dried immediately after printing, there is a case where the pattern may drop and the opening may become smaller. In the present invention, after printing, the paste is solidified by a solvent being sprayed, or the like, on the printing surface. By this means, dropping is suppressed, so that it is possible to realize stable manufacturing.

After a cured polyimide film is formed, a contact portion is partially open to form an electrode.

EXAMPLES

While the present invention will be more specifically described below using examples of the present invention and comparative examples, the present invention is not limited to these examples.

Examples 1 to 9, Comparative Example 1 and 2

A suppression effect of dropping of polyimide by spraying of a solvent was confirmed.

Specifically, printing was performed on a silicon substrate using a screen printing method using polyimide for screen printing Q-IP-0997-N of PI R&D Co., ltd. A printing plate had a pattern such that a plurality of non-opening portions (non-printing portions) each having a diameter of 100 μm were provided, and printing was performed on the whole area other than these portions. Various kinds of solvents were sprayed on a printing surface of a substrate immediately after printing, the substrate was dried by a hot plate at 140° C., and a printing shape was observed with a microscope. Ten portions were observed for respective conditions, and average values of the obtained diameters of openings are indicated in Table 1.

TABLE 1

|  | Composition of solvent | Average value of diameters of openings(μm) |
| --- | --- | --- |
| Example 1 | Pure water | 98 |
| Example 2 | Ethanol | 95 |
| Example 3 | Acetic acid | 101 |
| Example 4 | 2-propanol | 96 |
| Example 5 | Ethylene glycol | 102 |
| Example 6 | Methanol | 98 |
| Example 7 | 1-butanol | 100 |

TABLE 1-continued

|  | Composition of solvent | Average value of diameters of openings(μm) |
|---|---|---|
| Example 8 | Water 50%, γ-butyrolactone 50% | 95 |
| Example 9 | Water 1%, γ-butyrolactone 99% | 98 |
| Comparative example 1 | None | 55 |
| Comparative example 2 | γ-butyrolactone | 43 |

While, in Comparative example 1 in which a solvent including a polar material was not sprayed, dropping occurred and the opening became smaller, by a solvent in Examples 1 to 7 being sprayed, it was possible to maintain the opening approximately 100 μm. Further, in Comparative example 2, an opening of γ-butyrolactone was small, and a suppression effect of dropping was not seen. However, as indicated in Examples 8 and 9, dropping was suppressed by only 1% of water being mixed in γ-butyrolactone.

Example 10

A solar cell was manufactured using the method of the present invention.

A phosphorous-doped {100} N-type as-cut silicon substrate having a thickness of 200 μm and specific resistance of 1 Ω·cm was immersed into an aqueous solution of 2% potassium hydroxide/2-propanol at 72° C. to form texture on both sides, and, subsequently, the substrate was cleaned in a mixed solution of hydrochloric acid/hydrogen peroxide heated at 75° C.

Then, a pair of two substrates were superimposed and placed in a heat treat furnace, subjected to heat treatment at 1000° C. for 10 minutes by introducing a mixed gas of BBr$_3$, oxygen and argon, and, subsequently, thermally oxidized in an oxygen atmosphere for three hours at 1000° C. to form masks. As a result of measurement using a four probe method, sheet resistance was 50Ω.

The mask on the back side was open using laser. As a laser source, a second harmonic of Nd:YVO$_4$ was used. The opening pattern was a shape of parallel lines at intervals of 1.2 mm. This was immersed into KOH at 80° C., whose concentration was 24% to remove the emitter layer at the opening portion.

Then, in an atmosphere of phosphoryl chloride, the substrates was subjected to heat treatment at 870° C. for 40 minutes in a state where light receiving surfaces are superimposed on each other to form a phosphorous diffusion layer at the opening portion.

Thereafter, the substrate was immersed into hydrofluoric acid whose concentration was 25% to remove surface glass and the masks.

After the treatment described above, an aluminum oxide film and a silicon nitride film were formed on both sides using a plasma CVD apparatus. Film thicknesses were respectively set at 10 nm and 100 nm on both sides.

Then, without the aluminum oxide film/the silicon nitride film being opened, an Ag paste was printed and dried respectively on the base layer and the emitter layer using a screen printer. This was burned in an air atmosphere of 780° C.

A polyimide paste was printed on this substrate in a pattern shape using a screen printer. After printing, pure water was uniformly sprayed on a printing surface, and the substrate was dried for 5 minutes at a belt furnace at 200° C.

At last, a low-temperature curing Ag paste was printed in a shape of six lines so as to be orthogonal to the existing finger electrode using a screen printer and cured for 30 minutes at a belt furnace at 300° C. to make bus bars.

Comparative Example 3

In Example 10, after the polyimide paste was printed, the substrate was dried for 5 minutes at a belt furnace at 200° C. without pure water being sprayed. Thereafter, the bus bars were formed using a method similar to that in Example 10.

Appearance of samples of two types of solar cells obtained as described above was observed with a microscope. While, in the comparative example, portions where the bus bars which should have been connected to the fingers were clogged by a cured polyimide film were found here and there, in Example 10, such a portion was not confirmed.

Then, current-voltage characteristics were measured to obtain photoelectric conversion efficiency under a condition of AM 1.5 spectrum and irradiation intensity of 100 mW/cm$^2$ and 25° C. using a solar simulator manufactured by Yamashita Denso Corporation. Average values of the obtained results are indicated in Table 2.

TABLE 2

|  | Photoelectric conversion efficiency (%) | Short-circuit current (mA/cm$^2$) | Open-circuit voltage (mV) | Fill factor (%) |
|---|---|---|---|---|
| Example 10 | 22.4 | 40.9 | 684 | 80.1 |
| Comparative example 3 | 19.0 | 40.3 | 684 | 68.9 |

Compared to Comparative example 3, in Example 10, conversion efficiency is high. In comparative example 3, because portions where the bus bars cannot be electrically connected to the fingers occur by location as described above, internal resistance loss by finger resistance is excessively received, a fill factor decreases, and the conversion efficiency decreases. Because, in the example, the bus bars are reliably connected to the fingers, high photoelectric conversion efficiency is exhibited.

Note that the present invention is not limited to the above-described embodiment. The above-described embodiment is an example, and any invention having a configuration substantially the same as technical idea recited in claims of the present invention is incorporated into a technical scope of the present invention.

The invention claimed is:

1. A drying method of a polyimide paste which includes an organic solvent and a polyimide resin dissolved in the organic solvent, and which becomes cured polyimide by being cured as a result of being dried and heated, the drying method comprising:
   a step of applying the polyimide paste to a surface of a base material;
   a step of applying a solvent including a polar material to a surface of the base material at least at a portion where the polyimide paste is applied; and
   a step of, after applying the solvent including the polar material, drying the polyimide paste and the solvent including the polar material.

2. The drying method of the polyimide paste according to claim 1,
wherein the polar material is at least one type among water, ethylene glycol, acetic acid, methanol, ethanol, 1-propanol, 2-propanol, 1-butanol, and formic acid.

3. The drying method of the polyimide paste according to claim 1,
wherein the solvent including the polar material is a solvent which includes the polar material of equal to or more than one percent by mass.

4. The drying method of the polyimide paste according to claim 2,
wherein the solvent including the polar material is a solvent which includes the polar material of equal to or more than one percent by mass.

5. A manufacturing method of a solar cell which includes a cured polyimide film formed with cured polyimide as part of a structure of the solar cell, the manufacturing method comprising:
a step of, when the cured polyimide film is formed, drying a polyimide paste using the drying method of the polyimide paste according to claim 1.

6. A manufacturing method of a solar cell which includes a cured polyimide film formed with cured polyimide as part of a structure of the solar cell, the manufacturing method comprising:
a step of, when the cured polyimide film is formed, drying a polyimide paste using the drying method of the polyimide paste according to claim 2.

7. A manufacturing method of a solar cell which includes a cured polyimide film formed with cured polyimide as part of a structure of the solar cell, the manufacturing method comprising:
a step of, when the cured polyimide film is formed, drying a polyimide paste using the drying method of the polyimide paste according to claim 3.

8. A manufacturing method of a solar cell which includes a cured polyimide film formed with cured polyimide as part of a structure of the solar cell, the manufacturing method comprising:
a step of, when the cured polyimide film is formed, drying a polyimide paste using the drying method of the polyimide paste according to claim 4.

9. A manufacturing method of a solar cell which includes a cured polyimide film formed with cured polyimide as part of a structure of the solar cell, the manufacturing method comprising:
a step of forming a pn junction which joins a p-type layer and an n-type layer within a semiconductor substrate;
a step of forming a p-type electrode which electrically contacts the p-type layer; and
a step of forming an n-type electrode which electrically contacts the n-type layer, and, further, when the cured polyimide film is formed,
a step of applying a polyimide paste which includes an organic solvent and a polyimide resin dissolved in the organic solvent, and which becomes the cured polyimide by being cured as a result of being dried and heated, to a surface of a structure including the semiconductor substrate;
a step of applying a solvent including a polar material of at least one type among water, ethylene glycol, acetic acid, methanol, ethanol, 1-propanol, 2-propanol, 1-butanol, and formic acid, to a surface of the structure including the semiconductor substrate at least at a portion where the polyimide paste is applied;
a step of, after applying the solvent including the polar material, drying the polyimide paste and the solvent including the polar material; and
a step of heating and curing the dried polyimide paste to form the cured polyimide film.

10. The manufacturing method of the solar cell according to claim 9,
wherein the solvent including the polar material is a solvent which includes the polar material of equal to or more than one percent by mass.

* * * * *